United States Patent
Shin (10) Patent No.: US 6,380,817 B1
(45) Date of Patent: Apr. 30, 2002

(54) OSCILLATORS WITH THE MULTI-LAYER NON-RADIATIVE DIELECTRIC WAVEGUIDE STRUCTURE

(75) Inventor: Cheon Woo Shin, 13-205, Samick-Apartment, 148, Namcheong-Dong, Suyong-Ku, 613-010, Pusan (KR)

(73) Assignees: Sensing Tech, Corp.; Cheon Woo Shin, both of Pusan (KR)

( * ) Notice: Subject to any disclaimer, the term of this patent is extended or adjusted under 35 U.S.C. 154(b) by 0 days.

(21) Appl. No.: 09/631,402

(22) Filed: Aug. 3, 2000

(51) Int. Cl.$^7$ .................................................. H01P 5/00
(52) U.S. Cl. ................. 331/961; 331/107 DP; 331/107 G; 331/107 SL; 331/175
(58) Field of Search ............................ 331/96, 107 DP, 331/107 G, 177 V, 107 SL, 175

(56) References Cited

U.S. PATENT DOCUMENTS 5,982,255 A * 11/1999 Tanizaki et al. ............ 333/239

* cited by examiner

Primary Examiner—Arnold Kinkead
(74) Attorney, Agent, or Firm—The Maxham Firm (57) ABSTRACT

The present invention relates to an oscillator with the multi-layer non-radiative dielectric waveguide structure, which is able to generate various frequencies through oscillator elements and resonators, built in a multi-space structure with non-radiative dielectric waveguides of different sizes. Because it would not be necessary to construct many different packages in order to generate various frequencies, the present invention has an economical advantage.

7 Claims, 14 Drawing Sheets

STRIP 1

OSCILLATORS WITH THE MULTI-LAYER NON-RADIATIVE DIELECTRIC WAVEGUIDE STRUCTURE

BACKGROUND OF THE INVENTION

1. Field of the Invention

The present invention relates to an oscillator, in particular, an oscillator and a voltage control oscillator of the multi-space non-radiative dielectric waveguide structure, which may create waves of various frequencies through oscillator elements (e.g., Gunn Diode, etc.) and resonators built in the multi-layer structure having non-radiative dielectric waveguides of different sizes.

2. Description of Related Art

In this age of multimedia, the contents of information delivery is changing from texts to graphics, and again from graphics to moving images. Moreover, the technique of expressing the contents is improving to provide delicate and high-resolution color images. As a result, heavy loads are imposed on the computer communication system. As one way to overcome this problem, the transmission line is upgraded from T1 level to T3 level. However, this does not solve the entire problem. There may be a case where an optical fiber construction is not feasible. There may also be a necessity to support ultra-high speed information terminals. Thus, we are encountered with an urgent need to develop an ultra-high speed wireless transmitter.

In order to transmit more date in a given time, higher frequency should be used. Using higher frequency, however, entails various problems such as greater transmission loss caused by shortened wavelength. The MMIC method is one general way of processing information in a microwave band or a band above such microwave. In this method, however, the transmission loss amounts to 60 dB per 1 m at the frequency of 50 GHz, causing problems to the circuit construction.

Recently, as a way of solving the problem of transmission loss, the non-radiative dielectric waveguide is used. The non-radiative dielectric waveguide, because it is non-radiative, has a lower transmission loss rate than a microstrip circuit. With the non-radiative dielectric waveguide, a transmission line may be built more easily than with other waveguides. The non-radiative dielectric waveguide is expected to be particularly suitable for the transmission line for microwaves, in particular, for waves with wavelengths of 30 GHz or higher.

Figure 1:
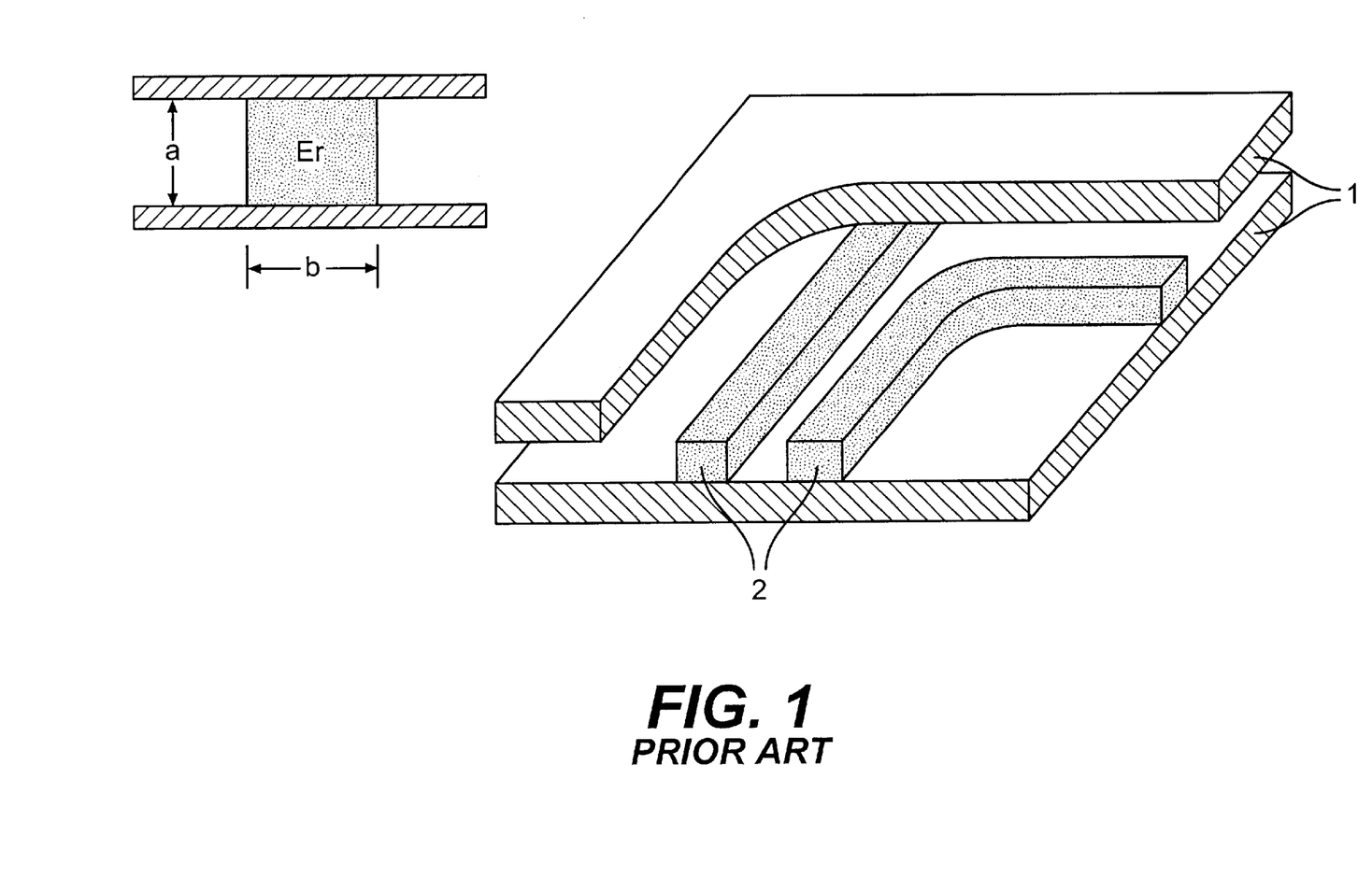
FIG. 1 is a partial cross-sectional diagram showing the structure of a conventional non-radiative dielectric waveguide.

A non-radiative dielectric waveguide(2) of a size in a certain proportion of the wavelength of frequency is inserted between two parallel metal plates(1) as shown in FIG. 1. The parallel metal plates(1) must be apart from each other by at least ½ of the wavelength of the frequency to be used.

The size of the non-radiative dielectric waveguide to be used is determined through the following equations. When the space between the two parallel metal plates(1) is determined by a frequency, waves of such frequency may be transmitted with a low transmission loss, but if the frequency is changed, the transmission becomes impossible.

$$a/\lambda \approx 0.45 \quad \text{[Equation 1]}$$

$$\frac{\sqrt{\varepsilon_r - 1}b}{\lambda} \approx 0.4 \sim 0.6 \quad \text{[Equation 2]}$$

In the above equations, $\varepsilon_r$ is the dielectric constant and $\lambda$ is the wavelength.

In order to determine the size of the dielectric block, the frequency to be used should be determined. Also, given the determined size of the dielectric block, the frequency to be used cannot be changed any more. In other words, in order to transmit waves of a particular wavelength, the size of the dielectric block and the space between two metal plates should be determined. Thus, the dielectric blocks to be inserted into a space between metal places, which space is also determined, and all the other circuits must have a single fixed size.

Figure 2:
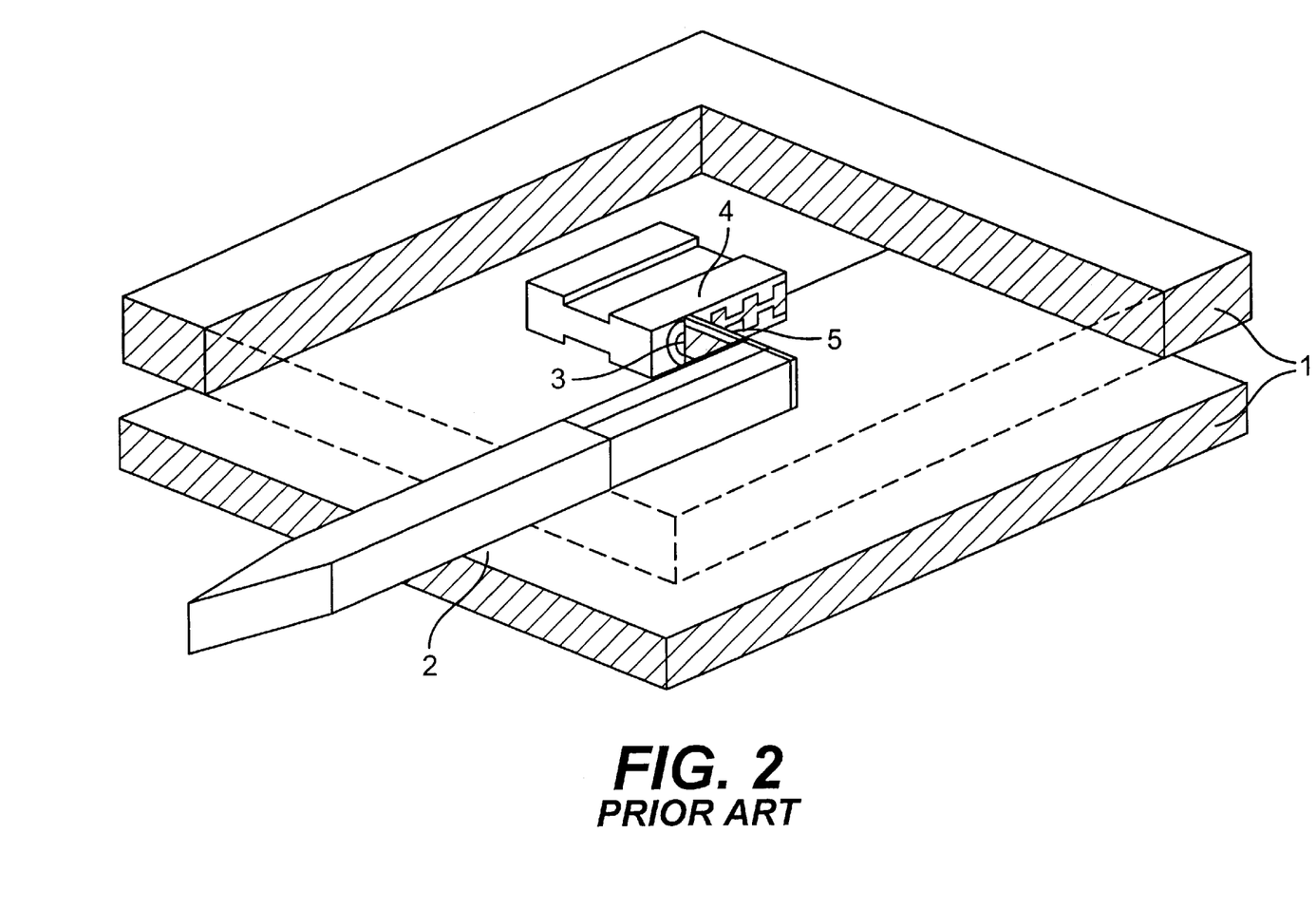
FIG. 2 is a partial cross-sectional diagram illustrating an oscillator of a conventional non-radiative dielectric waveguide.

FIG. 2 is a partial cross-sectional diagram of an oscillator in the conventional non-radiative dielectric waveguide. A diode mount(4) with Gunn diodes(3) is installed between the parallel metal plates(1), and a metal strip line(5) connects the said diode mount(4) and the non-radiative dielectric waveguide(2), enabling signals to be transmitted.

An oscillator constructed in the above-mentioned manner has shortcomings, in that the non-radiative dielectric waveguide(2) and other components(3~5) should be of a fixed size, because size of the space between the said two metal plates(1) is already determined.

As an example, in the above equations 1 and 2, suppose that a non-radiative dielectric waveguide has a dielectric constant of 2.04 and a wavelength of 5 mm at a frequency of 60 GHz. Then the height (a) of the dielectric block turns out to be 2.25 mm and the width (b) 2.5 mm. Thus, the space between two metal plates should be 2.25 mm.

In other words, because size of the space between the two metal plates(1) is predetermined, components or non-radiative dielectric waveguides of other sizes may not be inserted into such space. The size of a non-radiative dielectric waveguide is determined by the wavelength of a frequency. If the space between two metal plates is fixed, then only the frequency with a particular wavelength may be processed. As a result, most of the conventional high frequency circuits for various frequencies may not be constructed, rendering the non-radiative dielectric waveguide less useful.

For most of the high frequency circuits, such as AM/FM receivers, TV sets, cellular phones, pagers, cordless phones, wireless devices, and receivers for satellite broadcasting, are made through the super-heterodyne method. Using such super-heterodyne method, which may enhance the amplitude by converting the frequency in the middle of signal processing, a receiver with high sensitivity may be built.

Most transmitters also conduct modulation at a low frequency for high quality modulation and increase the amplitude of the transmission frequency by multiplying the low frequency and increasing the modulation index. In the conventional non-radiative dielectric waveguides with a fixed space between two metal plates, such frequency conversion cannot be done and thus only a predetermined particular frequency may be used. Therefore, most of the high frequency circuits listed above may not be constructed.

Furthermore, in the current of high speed data communication, the size of a non-radiative dielectric waveguide should become smaller as the frequency which are used these days becomes higher. For example, the size of a non-radiative dielectric waveguide is 2.25 mm×2.5 mm at the frequency of 60 GHz, but if the frequency is 120 GHz, the size should be 1.125 mm×1.25 mm, the half size of that for the frequency of 60 GHz. In this case, the waveguide may be built at such size, but semiconductors comprised of other components, such as the Gunn diode, may not be reduced in size because of the internal heat and may not be inserted. For example, most of the semiconductors on the market have a diameter of 3 mm, and these cannot be inserted into the space of 1.25 mm.

SUMMARY OF THE INVENTION

An object of the present invention is to provide a high frequency oscillator and a voltage control oscillator with various diodes and non-radiative dielectric waveguides of different sizes in one package by using multi-layer structured non-radiative dielectric waveguides. The present invention would solve the problems of the conventional non-radiative dielectric waveguide oscillator that different sized diodes for the oscillator are required in order to change the oscillator frequency, because all components of the circuit should be located between two metal plates having a predetermined space between them.

DETAILED DESCRIPTION OF THE PREFERRED EMBODIMENTS

In accord with the above object, the present invention provides an oscillator generating high frequency waves, wherein oscillator elements and non-radiative dielectric waveguide are installed between two metal plates of a fixed space size and a resonator is inserted in between the said oscillator elements and the non-radiative dielectric waveguide. In particular, the present invention provides a high frequency oscillator by:

constructing spaces of different sizes in accordance with the frequencies to be generated;

installing the oscillator element mount with big size oscillator elements for a low frequency between metal plates, the space between which metal plates is larger than other spaces;

installing the non-radiative dielectric waveguide of a size for high frequency waves between the metal plates of small space; and inserting a resonator between the said oscillator element mount and the non-radiative dielectric waveguide.

Furthermore, the present invention, in order to provide a voltage control oscillator which may convert the frequencies modulated from the said high frequency oscillator into voltage, provides a voltage control oscillator in which oscillator elements and the non-radiative dielectric waveguide are installed between two metal plates of a fixed space size and a resonator is inserted between the said oscillator elements and the non-radiative dielectric waveguide, by:

determining spaces of different heights in accordance with the frequencies to be generated;

installing the oscillator element mount with big size oscillator elements for a low frequency between metal plates, the space between which metal plates is comparatively big among other determined spaces;

installing the non-radiative dielectric waveguide of a size for high frequency waves between the metal plates of small space;

installing a varactor diode on the said oscillator element mount and the non-radiative dielectric waveguide; and inserting a resonator between the said oscillator element mount and the non-radiative dielectric waveguide.

The above-described objects, features and the advantages of the present invention will become clearer through the following detailed description of the present invention made with reference to the attached drawings. The following are the detailed description of the preferred embodiments of the present invention.

Figure 3:
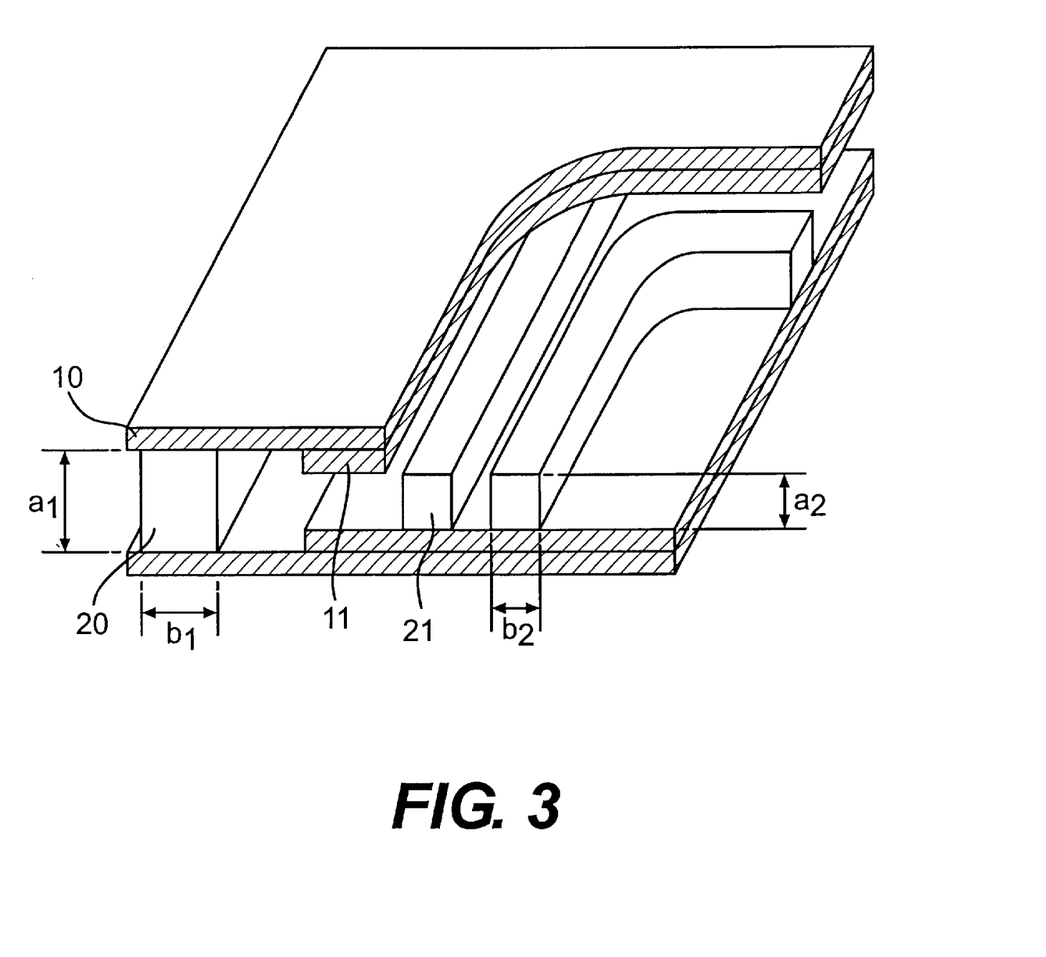
FIG. 3 is a partial cross-sectional diagram illustrating a non-radiative dielectric waveguide with a multi-space structure of the present invention.

FIG. 3 is a partial cross-sectional diagram of a multi-space structured non-radiative dielectric waveguide, which is used in the present invention. It illustrates a multi-layer structured non-radiative waveguide with multi-layered metal plates(10, 11) and non-radiative dielectric waveguides corresponding to various different frequencies(20, 21).

As illustrated in FIG. 3, by piling metal plates upon other metal plates(10, 11), the space between metal plates may be diversified, rendering it possible to structure non-radiative dielectric waveguides of various sizes for processing various frequencies and spaces of various sizes corresponding to such waveguides.

For example, the non-radiative dielectric waveguide(20) in FIG. 3 is a non-radiative dielectric waveguide used for a low frequency. The size of such waveguide is a1×b1 and the frequency to be used is determined by the above-described equations 1 and 2. The non-radiative dielectric waveguide (21) is a waveguide used for a high frequency. The frequency for such non-radiative dielectric waveguide(21) may be determined by the size a2×b2 and through the equations 1 and 2.

Connection between circuits of different frequencies may be made by a strip resonator or a reed resonator for transmission of signals.

Figure 4:
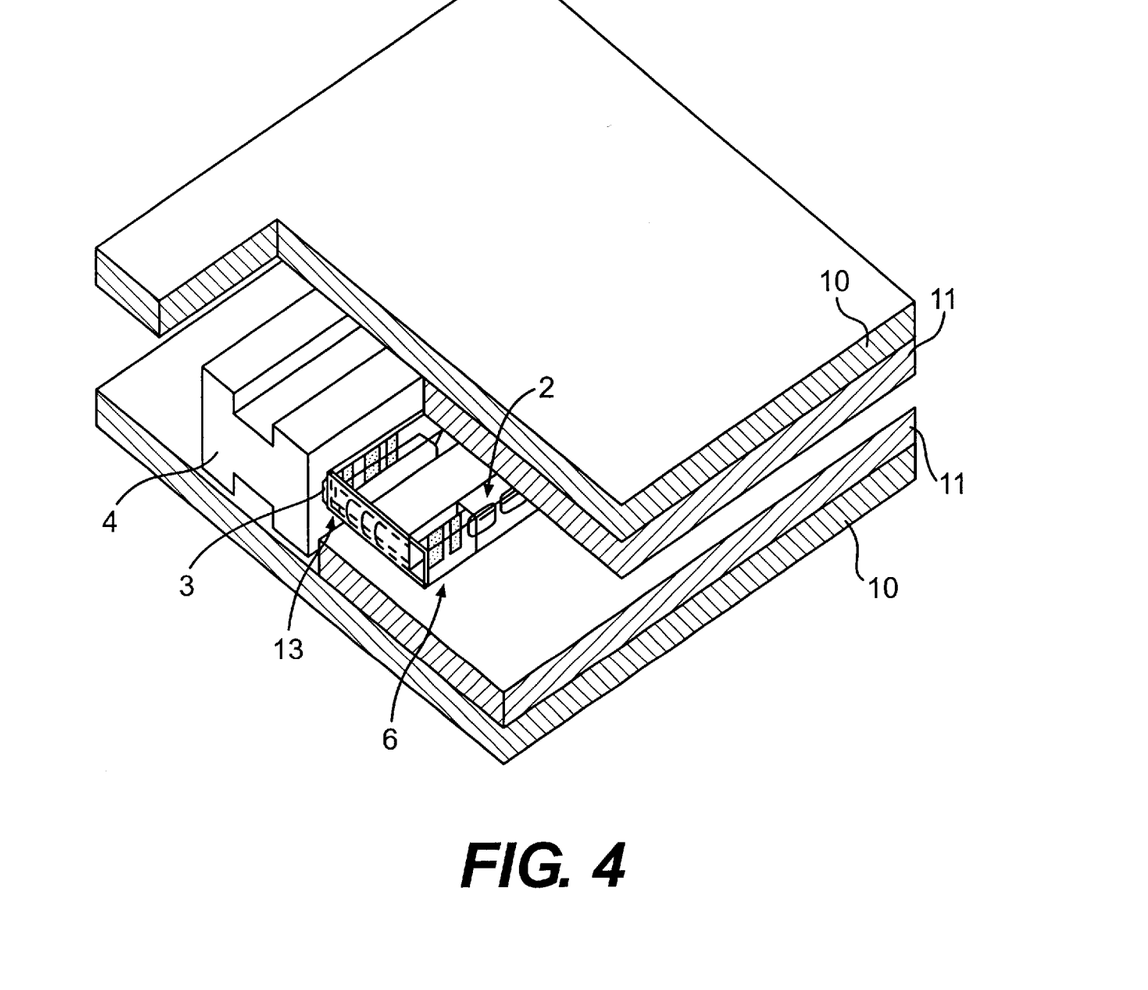
FIG. 4 is a partial cross-sectional diagram illustrating an oscillator of the present invention.

FIG. 4 is a partial cross-sectional diagram of an oscillator with a strip resonator on the multi-space structured non-radiative dielectric waveguide of the present invention. In the non-radiative dielectric waveguide oscillator which generates particular frequencies, a diode mount(4) with a Gunn diode(3) is inserted in a space between the metal plates of the multi-space structure, and the metal strip resonator(5) connects the said diode mount(4) and the non-radiative dielectric waveguide(2).

Figure 5:
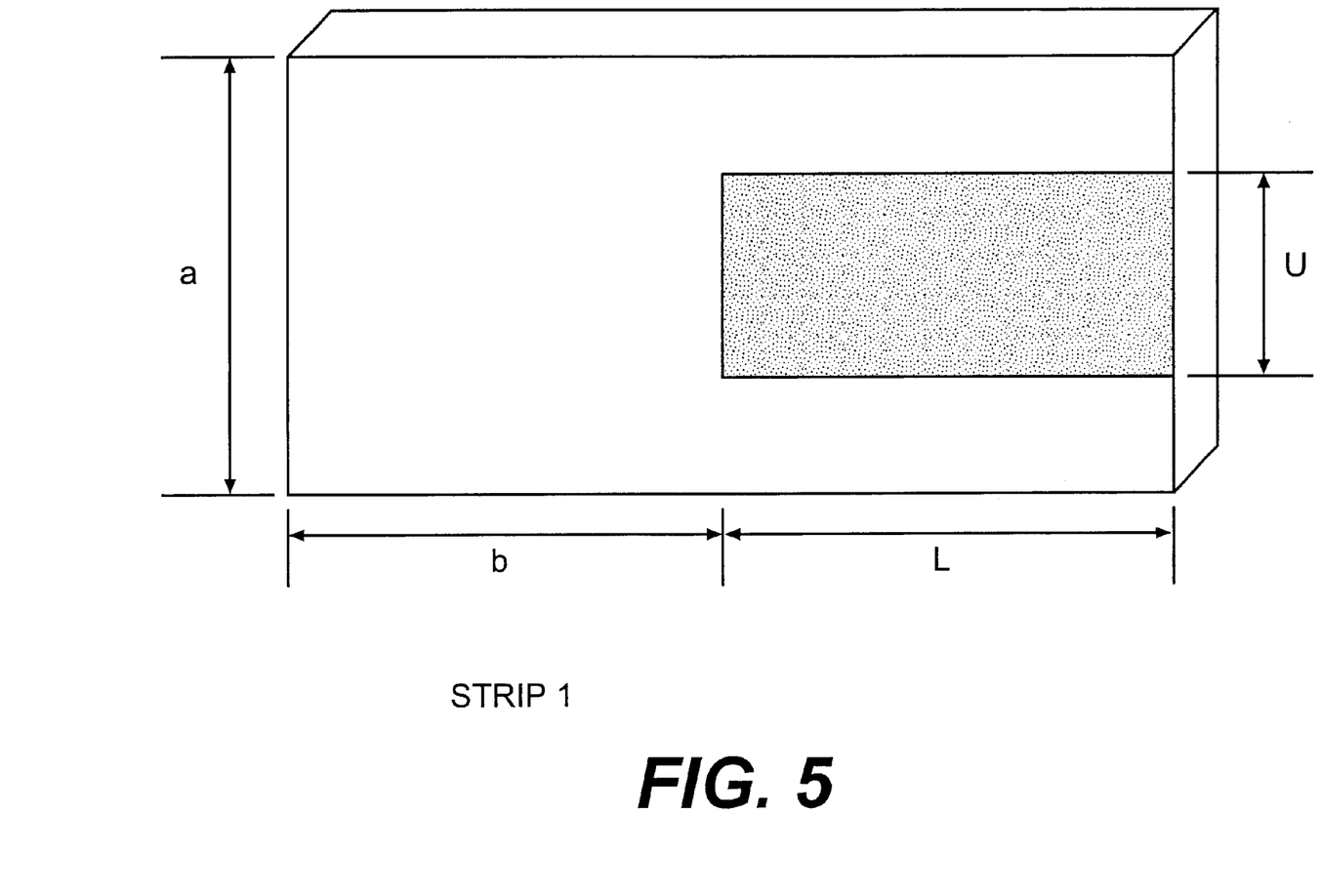
FIG. 5 is a partial cross-sectional diagram showing a strip resonator used in FIG. 4.

The frequency of millimeter waves generated from the oscillator diodes is not stable, because the internal parameters of the oscillator elements are composed of inductance and capacitance, affected by changes in external temperature and bias voltage. Instability of the oscillator frequencies may cause substantial harm to the communication device using such oscillator. Thus, a strip resonator(15) as shown in FIG. 5 is attached to stabilize the frequency. The length of the copper-clad part(L) of the strip resonator in FIG. 5 determines the frequency to be generated. If L, the determinant of the frequency, becomes larger than about a half of the wavelength of the frequency to be used, the frequency becomes lower, and if L becomes smaller, the frequency to be generated higher. This is a strip of copper patterns, which can be made by etching or processing, etc.

Figure 6:
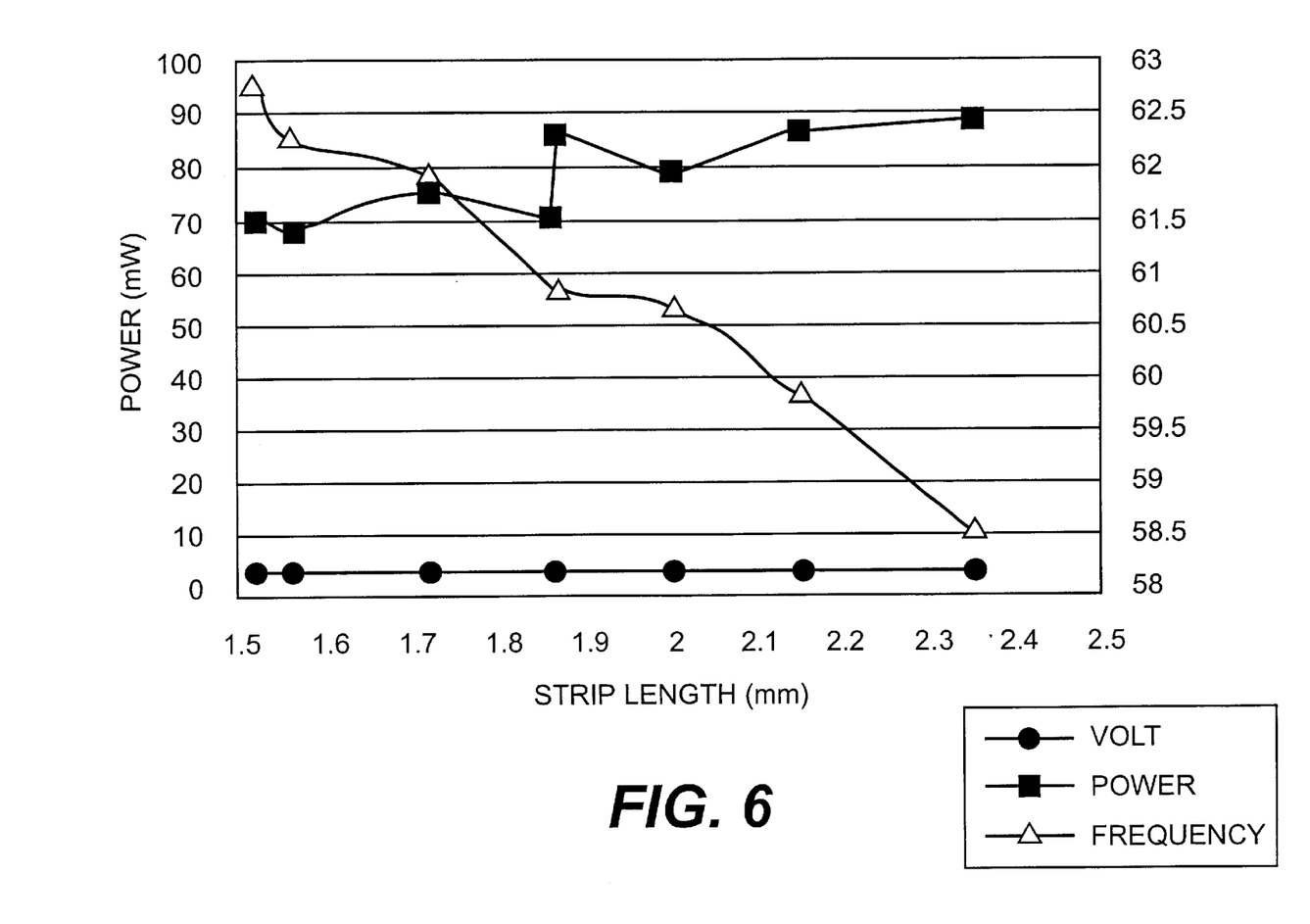
FIG. 6 is a graph showing changes in resonant frequencies and resonant outputs in an embodiment in accordance with FIG. 5.

FIG. 6 illustrates the changes in the resonant frequencies and the resonant outputs caused by the changes in the length(L) of the strip resonator(13)'s metal plates of the embodiment of FIG. 5. As illustrated in the figure, by changing the length(L) of the strip resonator(13)'s metal plates, the frequency may change. Even in this case, the change in the output is only slight. In this manner, with a strip resonator(13) and the multi-space type dielectric waveguides, the present invention provides a frequency converter with slight changes in output.

Figure 7:
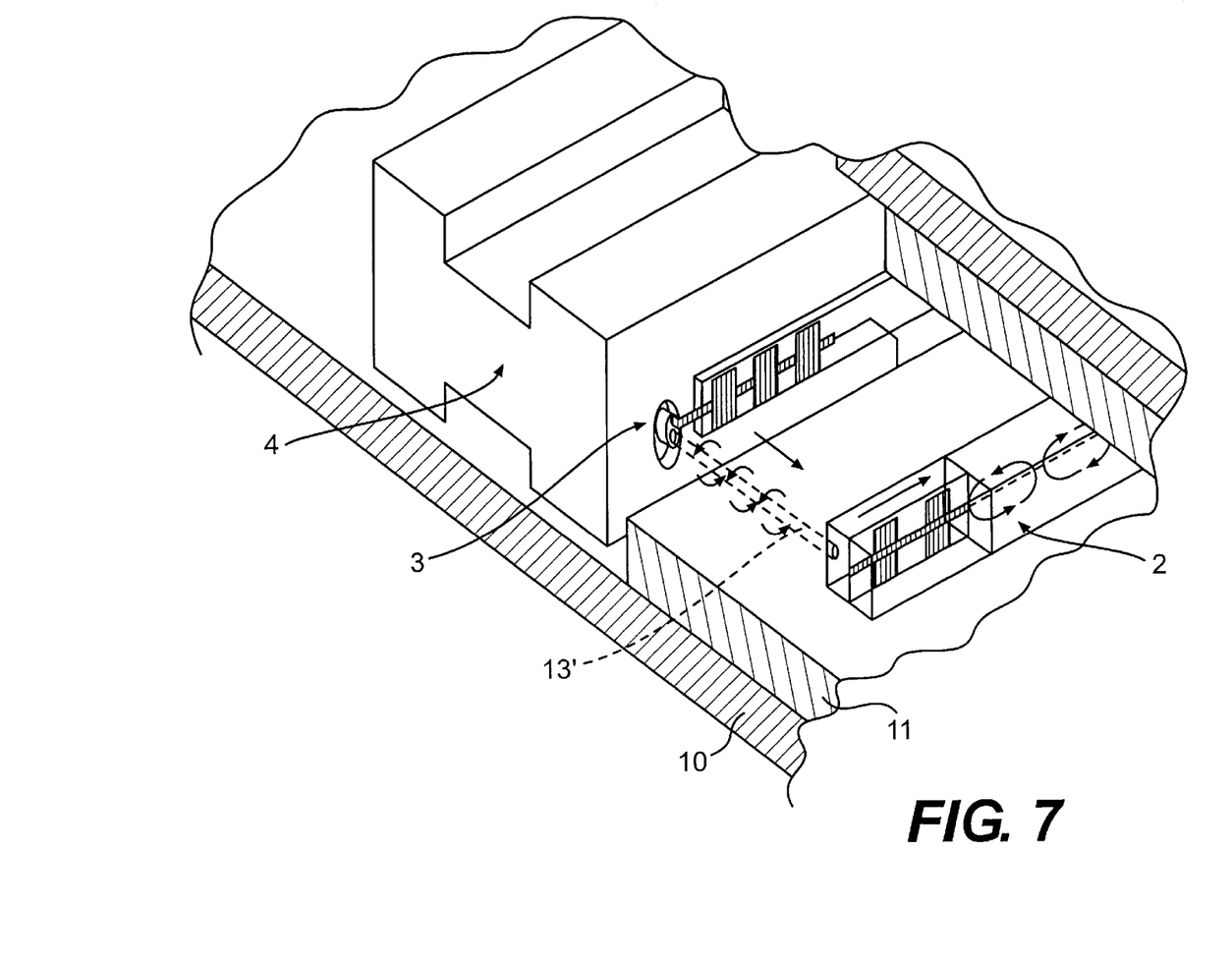
FIG. 7 is a partial cross-sectional diagram illustrating another embodiment of an oscillator of the present invention.

As another example, a reed type line illustrated in FIG. 7 may be used. FIG. 7 illustrates an oscillator using a reed type resonator(13') instead of a metal strip resonator. In this case also, the length of the reed determines the frequency of the waves to be generated. Because it is likely that the millimeter wave out of the strip resonator or the reed type resonator will have a parasitic mode, such millimeter wave should promptly pass the mode suppressor(6) and then be transmitted through the dielectric waveguides(2).

Figure 8:
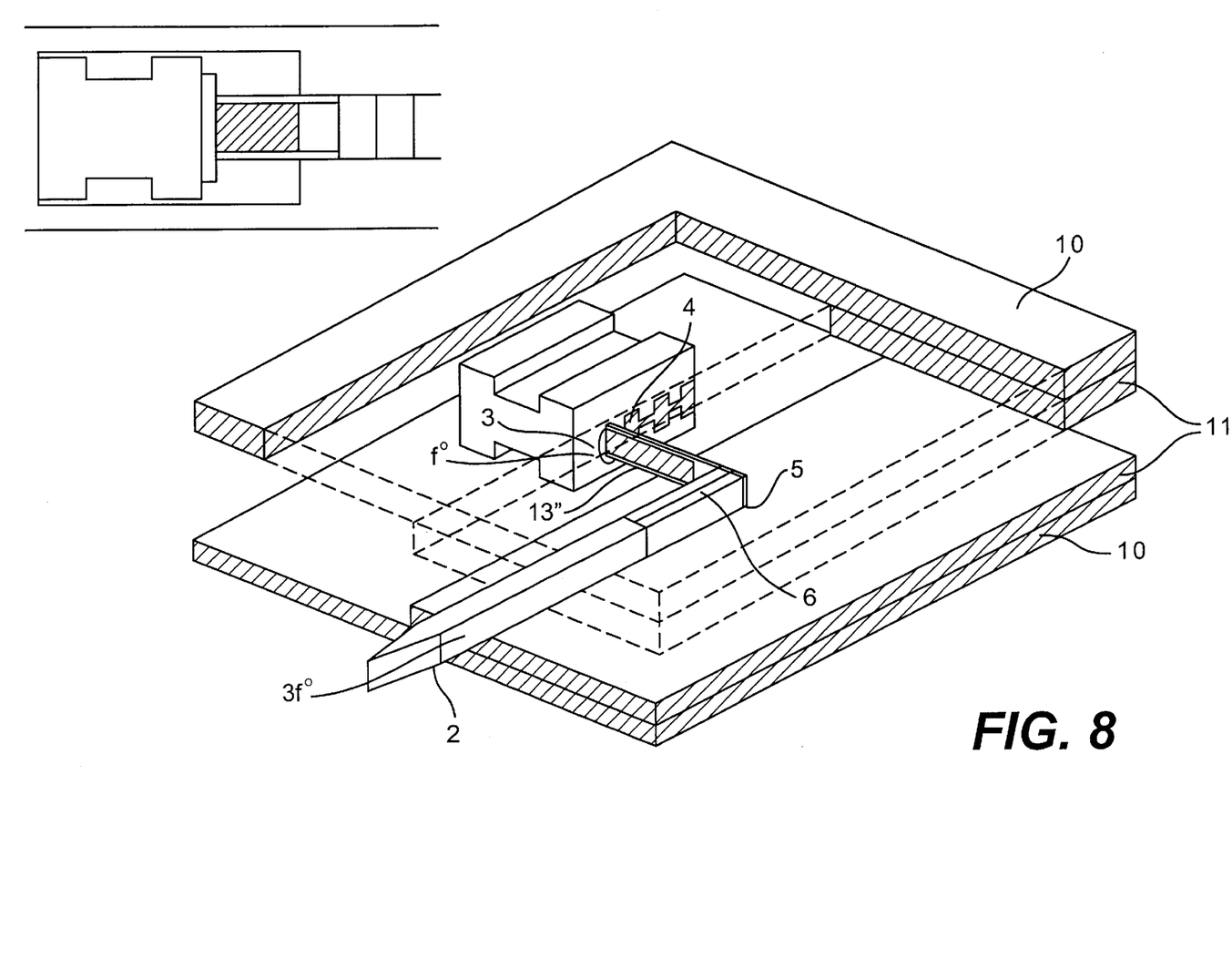
FIG. 8 is a partial cross-sectional diagram illustrating another embodiment of an oscillator of the present invention.

FIG. 8 is a partial cross-sectional diagram of a multipying oscillator with the multi-space structured non-radiative dielectric waveguide of the present invention and using diodes for oscillator parts, in order to generate higher frequencies than that with other diodes.

As illustrated in FIG. 8, the diode mount(4) is installed in the space between the metal plates(10) of the multi-space structure and the multiplying strip resonator(13") connects the said diode mount(4) and the non-radiative dielectric waveguide(2). Signals are to pass the mode suppressor(6) and be transmitted through the dielectric waveguide(2).

If the frequency of a diode of normal size is 20 GHz, a strip resonator or a reed type resonator may be connected to a diode of a size tuned for higher frequency waves, for example, for the second high frequency wave of 40 GHz or the third high frequency wave of 60 GHz. In this manner, frequencies corresponding to such resonant frequencies of 40 GHz or 60 GHz may be delivered and, as a result, an oscillator circuit generating the high frequencies of 40 GHz or 60 GHz is constructed. Consequently, by using the multi-space structured dielectric waveguides of the present invention and choosing a strip resonator or a reed type resonator suitable for the given purpose, various multiplying high-frequency oscillators such as the two-times multiplying oscillator generating double the frequency of the oscillator frequency or the three-times multiplying oscillator generating three times the frequency of the oscillator frequency.

Figure 9:
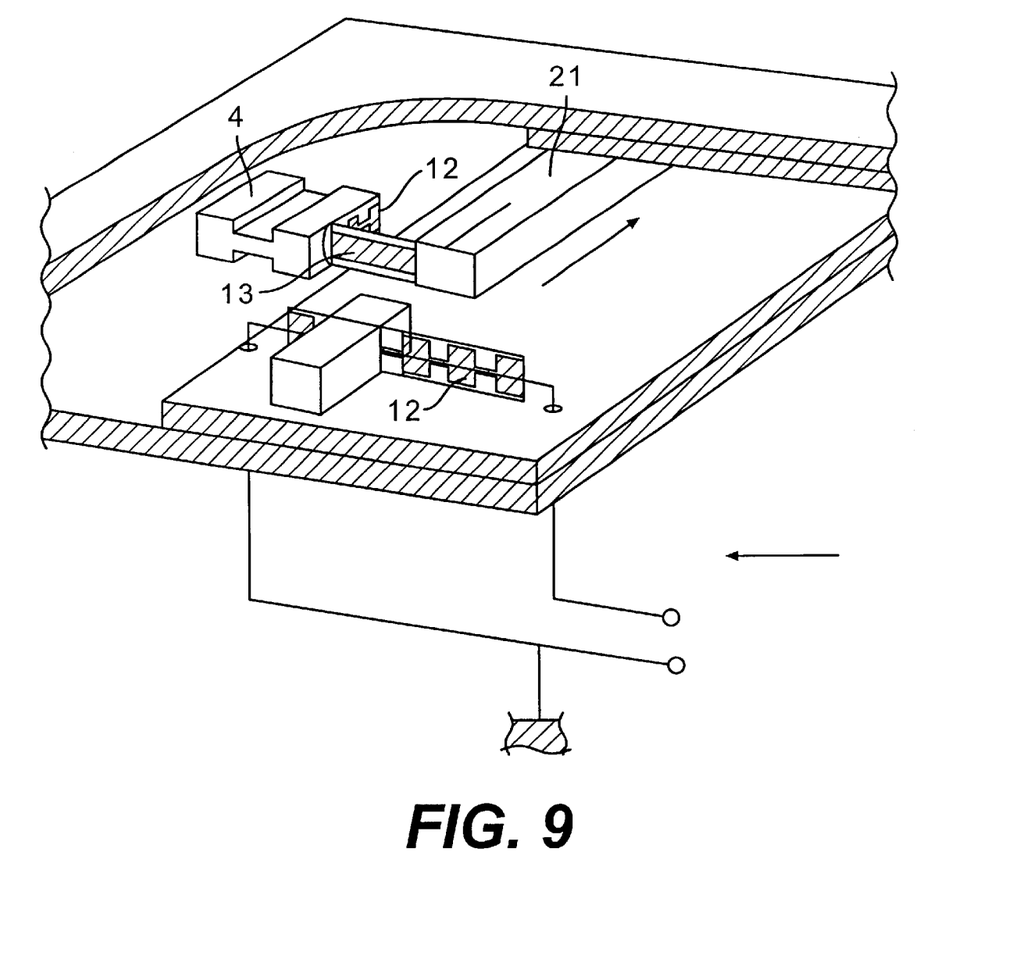
FIG. 9 is a partial cross-sectional diagram illustrating a voltage control oscillator of the present invention.

FIG. 9 is a partial cross-sectional diagram of a voltage control oscillator of the present invention. The voltage control oscillator may convert the frequency adjusted in the strip resonator(13) into voltage, by using the diode mount (4), which comprises oscillator elements (e.g., Gunn diode) installed in the multi-space structure non-radiative dielectric waveguide of FIG. 4, and the varactor diode substrate(12).

Figure 10:
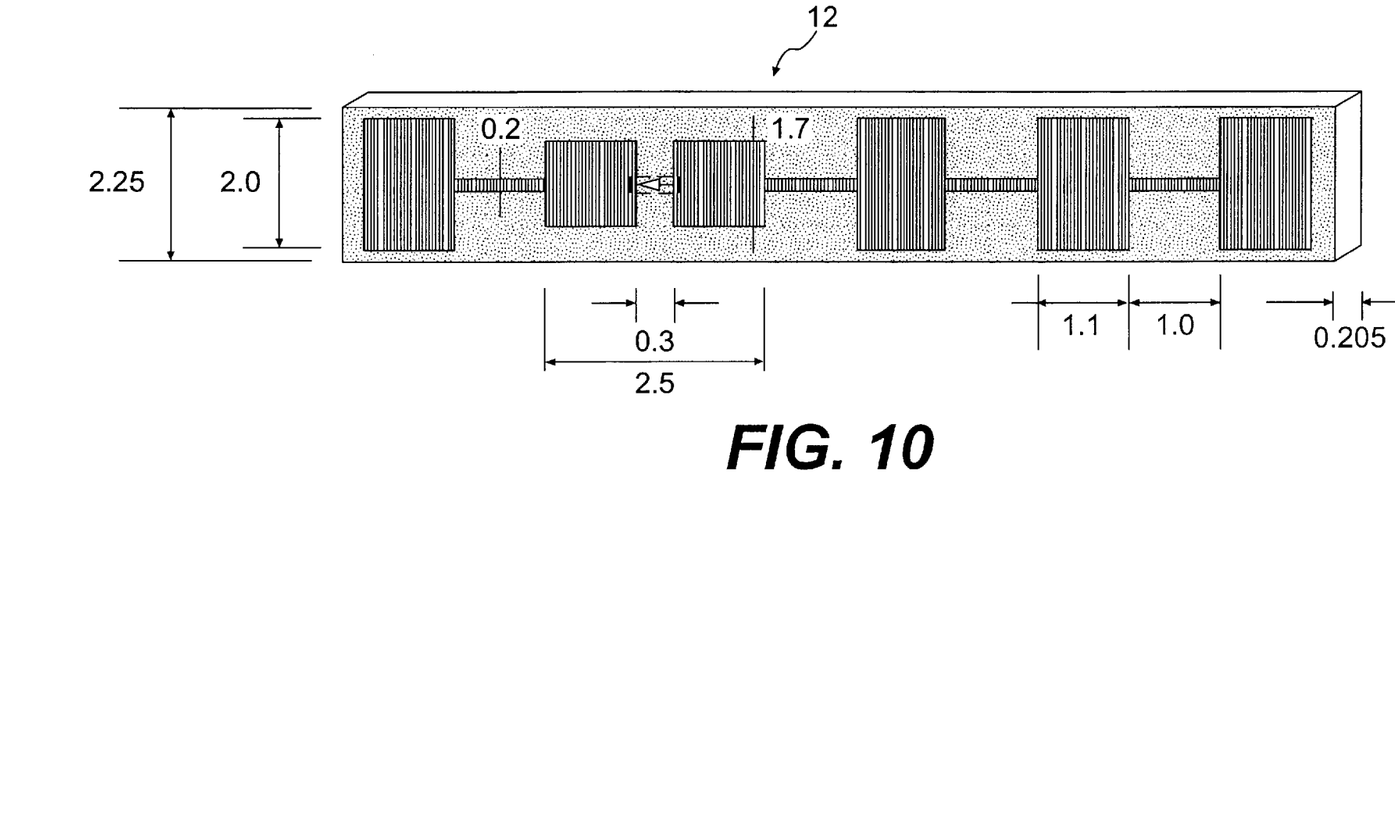
FIG. 10 is a partial cross-sectional diagram illustrating a varactor diode substrate used in the present invention.

It may be embodied as follows. First, the varactor diode substrate (an element which can change a condenser capacity by voltage)(12) is made. Such varactor diode substrate is placed at a resonant point around the diode mount(4) and the strip resonator(13), which resonant point should be apart from the original oscillator point and the resonant point.

In this manner, a voltage control oscillator, which is connected to the original resonant point and another resonant point, is constructed.

The said varactor diode is an element which may change its internal junction capacity by applying reverse voltage at the both ends of the diode and by changing such reverse voltage. A resonance circuit may be constructed with such varactor diode and the non-radiative dielectric waveguides around the varactor diode.

In the resonator constructed with the varactor diode and the non-radiative dielectric waveguides, the reverse voltage of the diode working as the resonator's capacity may be changed and such change in the capacity caused by the reverse voltage induces change in the frequency. Consequently, a frequency converter by the voltage change, which is the voltage control millimeter wave oscillator, may be constructed.

Figure 11:
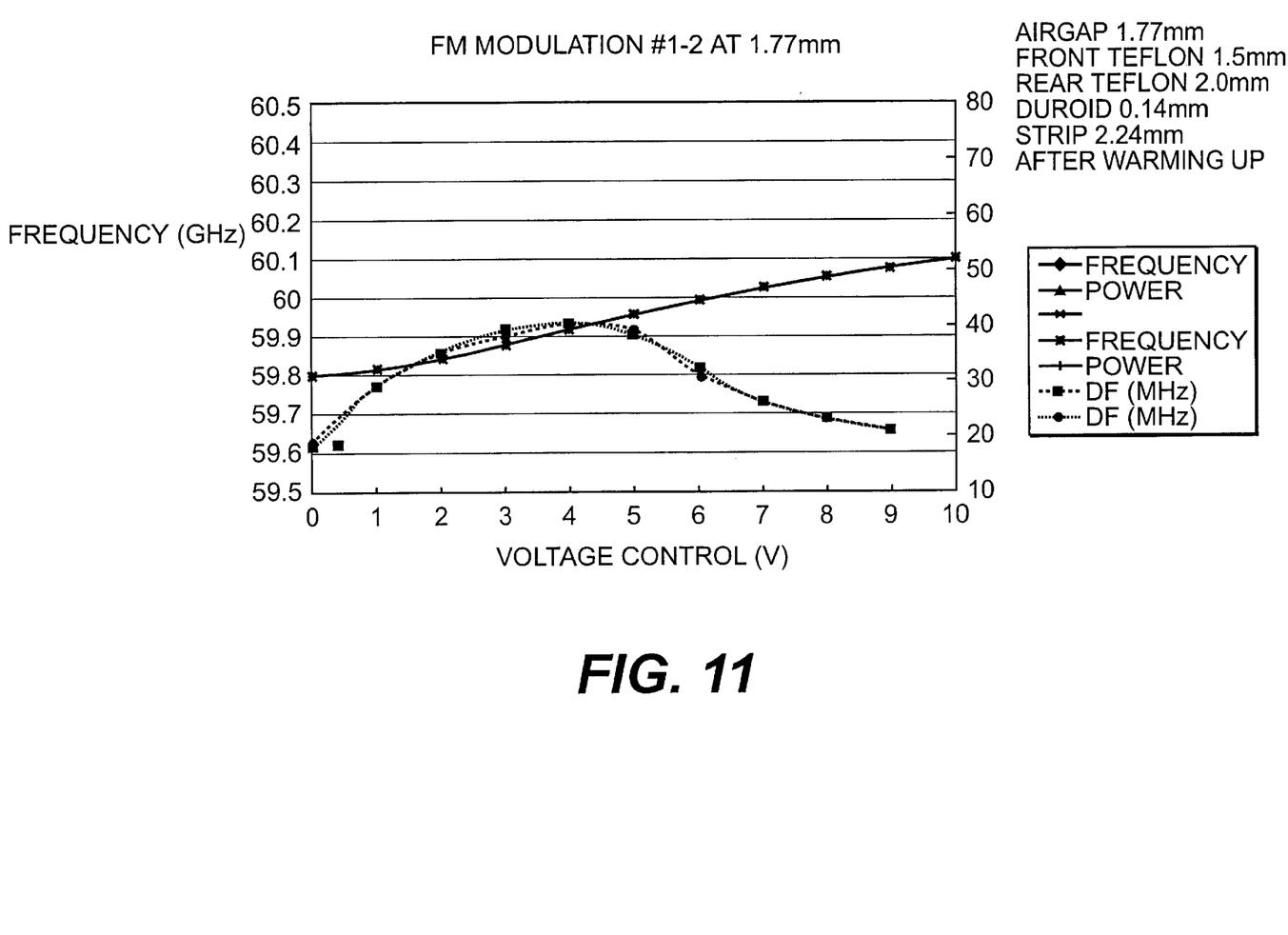
FIG. 11 is a graph showing changes measured in the oscillator frequencies caused by voltage changes in the voltage control oscillator implemented in accordance with FIG. 9.

FIG. 11 is a graph showing the changes in frequencies caused by the voltage changes in the above-described device. It illustrates the frequency changes occasioned by changes in the bias voltage of the varactor diode from 1V to 10V. We can see the increase in the frequencies caused by the varactor voltage changes.

Figure 12:
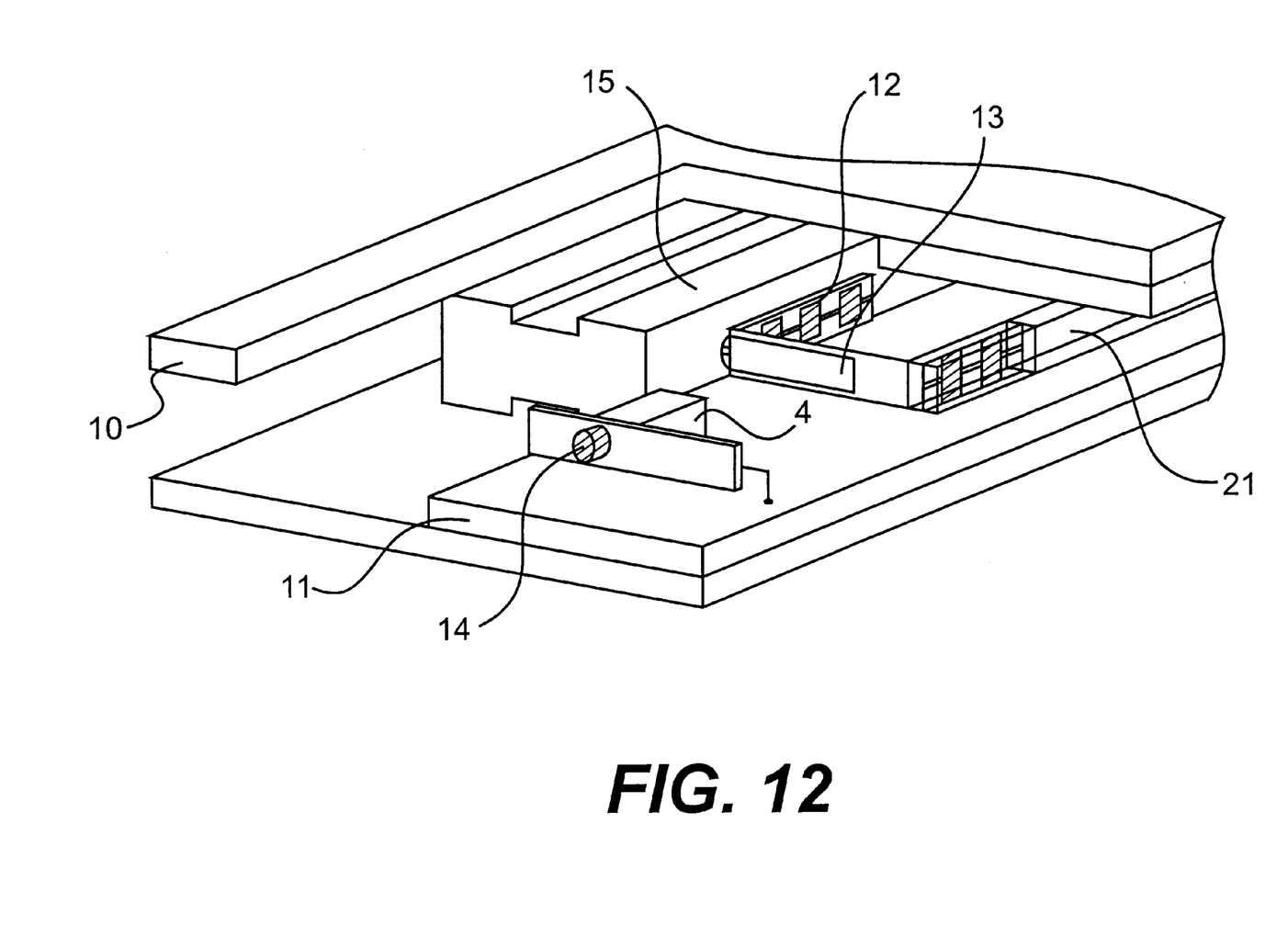
FIG. 12 is a partial cross-sectional diagram illustrating a voltage control oscillator equipped with a stabilizer for stabilizing the oscillator frequencies of the voltage control oscillator implemented in accordance with FIG. 11.

FIG. 12 is a partial cross-sectional diagram of a voltage control oscillator equipped with a stabilizer for stabilizing the frequencies of the voltage control oscillator embodied as illustrated in FIG. 11. Outputs from an oscillator obtained from the non-radiative dielectric waveguide(21) by using the Gunn diode mount(15) and the diode mount(4) have a low frequency stability because of changes in the temperature of the elements and in the externally induced bias voltages.

In order to solve such problem, as illustrated in FIG. 12, another resonator may be located around the strip resonator (13) for adjusting the strip resonator's coupling coefficient and a material with a high dielectric ratio may be inserted for the stabilization of the oscillator's frequencies.

As material for the stabilization of the said resonant frequencies, elements such as a ceramic resonator(14), which has a high dielectric ratio, are used. Such frequency stabilization material may also be used in a voltage control oscillator and in an FM modulator for a high frequency stability.

Figure 13:
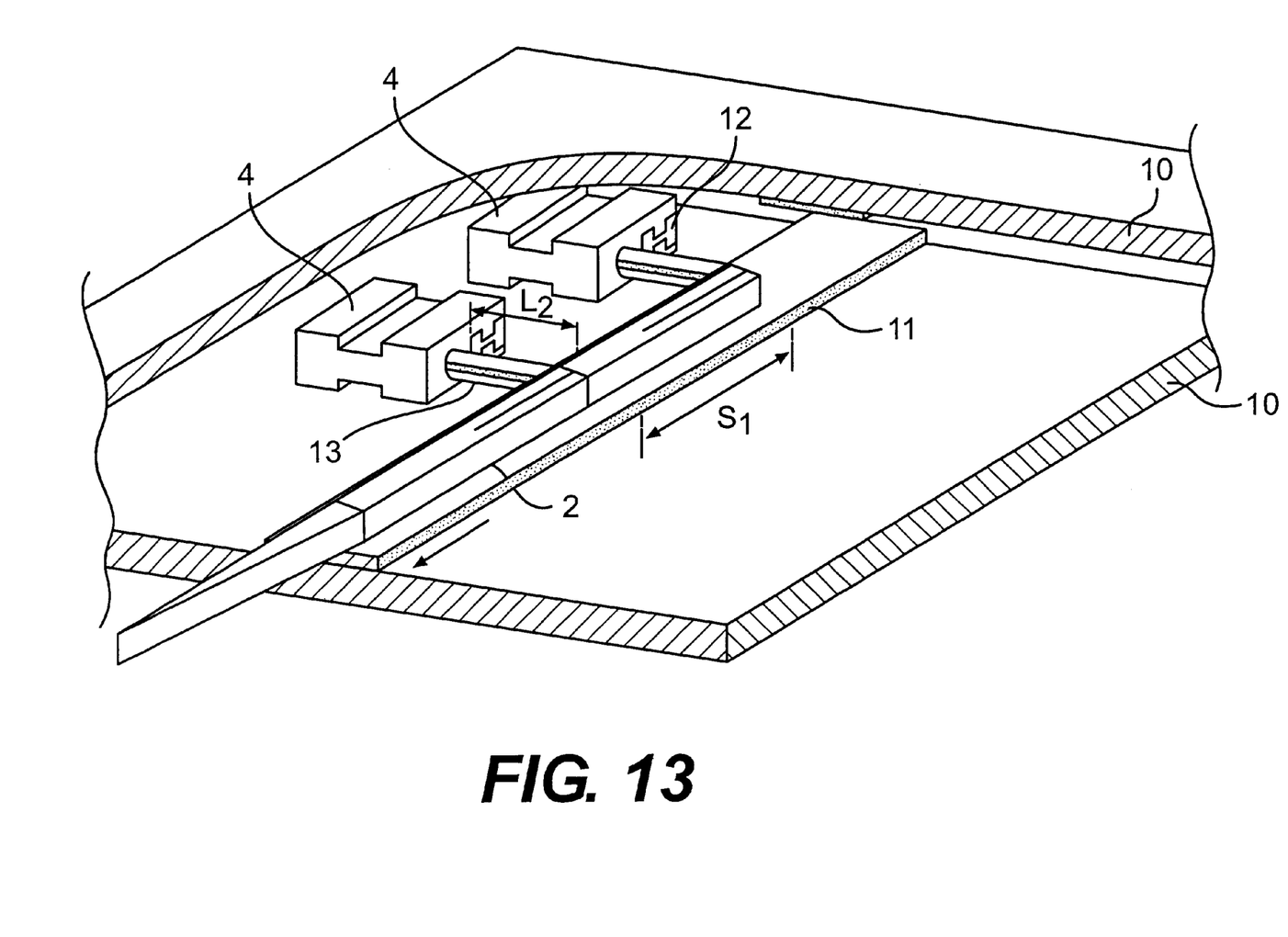
FIG. 13 is a partial cross-sectional diagram of a voltage control oscillator made for the purpose of amplifying outputs of the oscillator implemented in accordance with FIG. 11.
Figure 14:
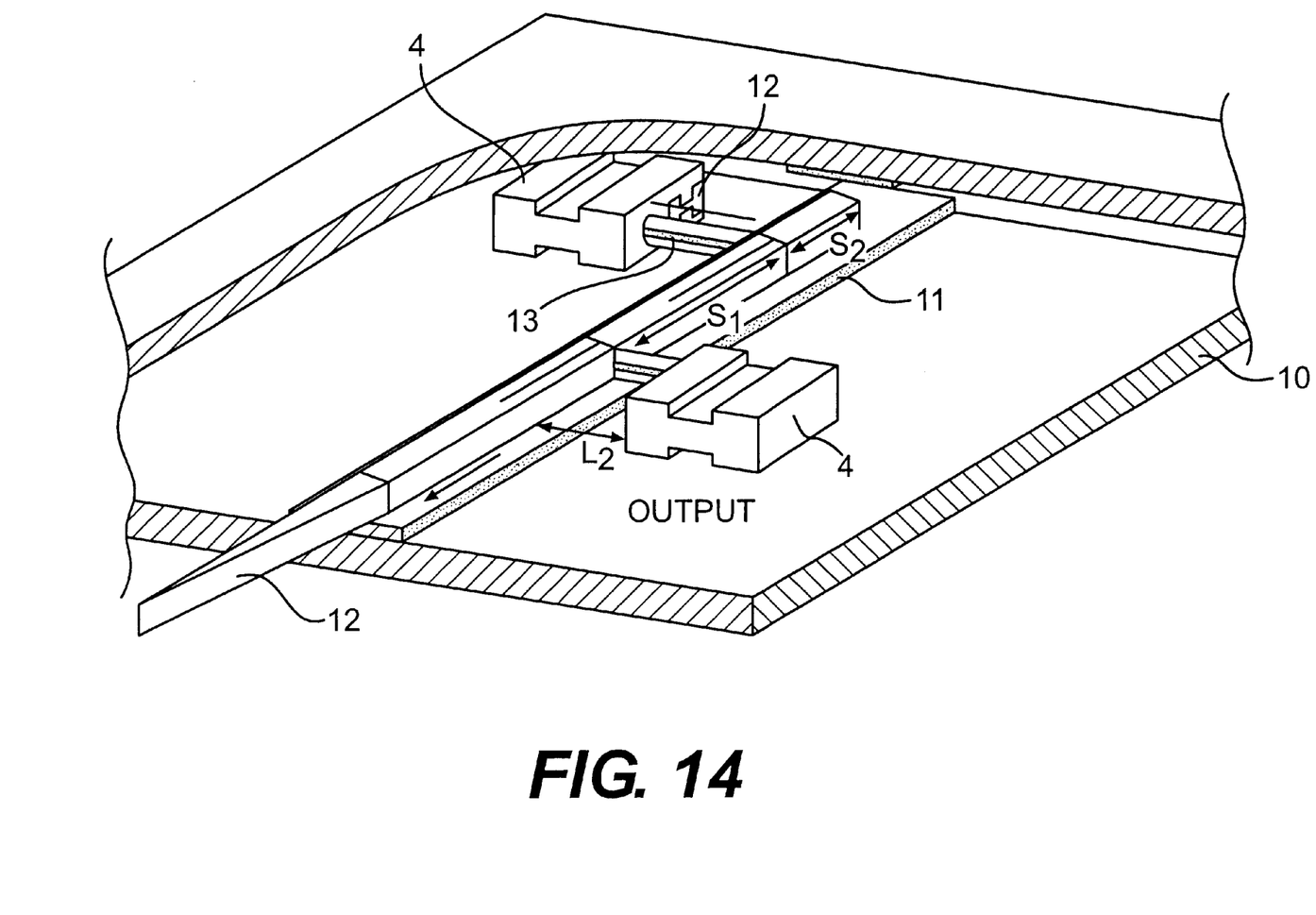
FIG. 14 is a partial cross-sectional diagram of another voltage control oscillator made for the purpose of amplifying the output of the oscillator implemented in accordance with FIG. 11.

FIG. 13 and FIG. 14 are partial cross-sectional diagrams of voltage control oscillators constructed to amplify the outputs of the voltage control oscillator implemented in accordance with FIG. 9. If outputs of oscillator elements are insufficient for circuits demanding ultra-high frequency outputs of high magnitude, then several diode mount(4) may be used to construct a circuit amplifying the oscillator's outputs. As illustrated in FIG. 13, after two diode mounts(4) are installed, if signals are transmitted through the non-radiative dielectric waveguide(21), then such non-radiative dielectric waveguide(21) combines and produces the oscillator outputs, which, as a result, are greater than those obtained from one oscillator element.

In the space between the metal plates(10, 11), the diode mounts(4) may be located at either one side of the non-radiative dielectric waveguide(21) as shown in FIG. 13 or at each side of the non-radiative dielectric waveguide(21) as shown in FIG. 14.

It is needless to say that more than two diode mounts(4) may be installed to further amplify the oscillator outputs when such outputs are insufficient.

As explained above in detail, the present invention has an economic advantage because it constructs a single oscillator or a voltage control oscillator with various oscillator elements and non-radiative dielectric waveguides of different sizes, through the multi-space non-radiative dielectric waveguide structure, making it unnecessary to construct many different packages in order to generate various frequencies.

The preferred embodiments of the present invention were provided for the purpose of illustrating the present invention. A person in the relevant art may be able to modify, change or add to certain features of the present invention within the concept and the scope of the present invention and, therefore, such modifications, changes or additions are deemed to be included in the following claims.

What is claimed is:

1. A method of making an oscillator generating high frequency waves, wherein oscillator elements and a non-radiative dielectric waveguide are installed between two metal plates of a fixed space and a resonator is inserted in between said oscillator elements and the non-radiative dielectric waveguide, the method comprising:

constructing spaces of different heights between said metal plates in accordance with the frequencies to be generated;

installing an oscillator element mount, with big-sized oscillator elements for a low frequency, between metal plates, the space between which metal plates is larger than other spaces between metal plates;

installing the non-radiative dielectric waveguide of a size corresponding to the high frequency waves, between the metal plates of small space; and inserting a resonator between said oscillator element mount and the non-radiative dielectric waveguide, wherein said resonator is a strip resonator or a reed type resonator, which may control the frequencies to be generated.

2. An oscillator generating high frequency waves, said oscillator comprising:

two metal plates of a fixed space, wherein said fixed space selectively has different heights between said metal plates in accordance with the frequencies to be generated;

oscillator elements and non-radiative dielectric waveguide positioned between said two metal plates and the non-radiative dielectric waveguide of a size corresponding to the high frequency waves, between the metal plates of small space;

a resonator between said oscillator elements and said non-radiative dielectric waveguide, wherein said resonator is a strip or reed type resonator, which may control the frequencies to be generated;

an oscillator element mount, with big-sized oscillator elements for a low frequency, between metal plates, the space between which metal plates is larger than other spaces between metal plates; and a varactor diode in said oscillator element mount and the non-radiative dielectric waveguide.

3. An oscillator according to claim 2, further comprising, a ceramic resonator in the non-radiative dielectric waveguide with said varactor diode, stabilizing the frequencies to be generated.

4. An oscillator according to claim 2, further comprising, at least two oscillator element mounts, located at one side of said non-radiative dielectric waveguide.

5. An oscillator according to claim 2, further comprising, at least two oscillator element mounts, located at each side of said non-radiative dielectric waveguide.

6. The method according to claim 1, further comprising, locating at least two oscillator mounts at one side of the said non-radiative dielectric waveguide, thereby amplifying outputs from the oscillator.

7. The method according to claim 1, further comprising, locating at least two oscillator mounts at each side of the said non-radiative dielectric waveguide, thereby amplifying outputs from the oscillator.

* * * * *